(12) United States Patent
Takasawa et al.

(10) Patent No.: US 8,585,872 B2
(45) Date of Patent: Nov. 19, 2013

(54) SPUTTERING APPARATUS AND FILM-FORMING PROCESSES

(75) Inventors: Satoru Takasawa, Sammu (JP); Sadayuki Ukishima, Sammu (JP); Noriaki Tani, Sammu (JP); Satoru Ishibashi, Sammu (JP)

(73) Assignee: ULVAC, Inc., Chigasaki-shi (JP)

( * ) Notice: Subject to any disclaimer, the term of this patent is extended or adjusted under 35 U.S.C. 154(b) by 1326 days.

(21) Appl. No.: 12/010,585

(22) Filed: Jan. 28, 2008

(65) Prior Publication Data
US 2008/0210547 A1     Sep. 4, 2008

Related U.S. Application Data

(63) Continuation of application No. PCT/JP2006/319962, filed on Oct. 5, 2006.

(30) Foreign Application Priority Data

Oct. 18, 2005  (JP) ................. 2005-303490

(51) Int. Cl.
    *C23C 14/35*      (2006.01)
(52) U.S. Cl.
    USPC ............. 204/192.12; 204/298.2; 204/298.19
(58) Field of Classification Search
    USPC ............. 204/192.12, 298.18, 298.19, 298.2
    See application file for complete search history.

(56) References Cited

U.S. PATENT DOCUMENTS 5,512,156 A * 4/1996 Yamanishi et al. ...... 204/298.16
6,641,702 B2 * 11/2003 Shi et al. .................. 204/192.12

FOREIGN PATENT DOCUMENTS

| EP | 1 905 865 | 4/2008 |
|---|---|---|
| JP | 57-158380 | 9/1982 |
| JP | 61-183466 | 8/1986 |
| JP | 61-243168 | 10/1986 |
| JP | 63-121657 | 5/1988 |
| JP | 3-6371 | 1/1991 |
| JP | 10-102247 | 4/1998 |
| JP | 2002-146529 | 5/2002 |

OTHER PUBLICATIONS

Machine Translation of Oka et al. (Japan 2002-146529) dated May 2002.*
Office Action dated Mar. 13, 2009 corresponding to Chinese Application No. 200680018096.8 with English translation.
European Search Report received on counterpart application No. 06811300.0 dated Mar. 2, 2012 (8 pages).
M. J. Murphy et al.: "Penning type magnetron sputtering source and its use in the production of carbon nitride coatings", *Journal of Vacuum Science and Technology*: Part A, AVS/AIP, Melville, NY, vol. 17, No. 1, Jan. 1, 1999, pp. 62-69.
Qihua Fan: "Uniformity of targets erosion and magnetic film thickness distribution in the target-facing-type sputtering method", *Journal of Vacuum Science and Technology*: Part A, AVS/AIP, Melville, NY, vol. 10, No. 5, Sep. 1, 1992, pp. 3371-3375.

* cited by examiner

*Primary Examiner* — Rodney McDonald
(74) *Attorney, Agent, or Firm* — Kratz, Quintos & Hanson, LLP

(57) ABSTRACT

A sputtering apparatus for ensuring high target utilization efficiency is provided. The sputtering apparatus 1 of the present invention comprises a moving means 28a, 28b so that first and second magnet members 23a, 23b can be moved by the moving means 28a, 28b in planes parallel to the surfaces of first and second targets 21a, 21b. When the first and second magnet members 23a, 23b move, magnetic field lines as well as deeply eroded regions on the surfaces of the first and second targets 21a, 21b also move, whereby large areas on the surfaces of the first and second targets 21a, 21b are sputtered.

4 Claims, 7 Drawing Sheets

Fig. 2
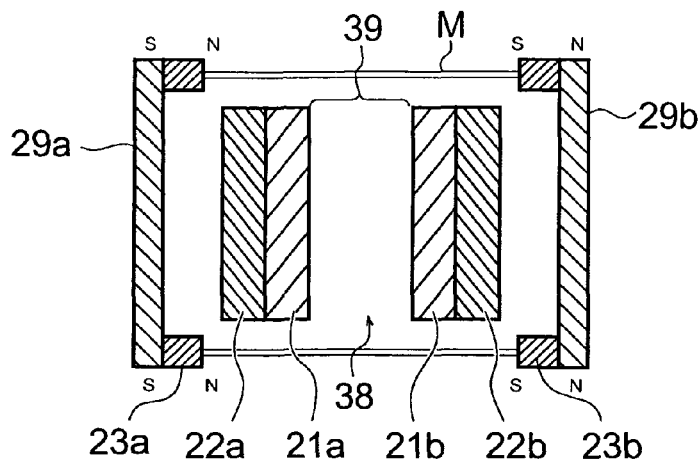
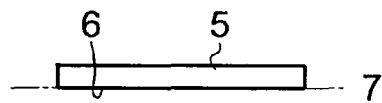
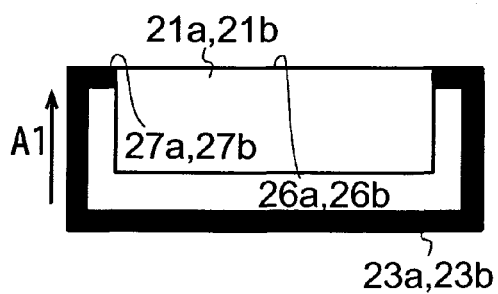
Fig. 3(a)
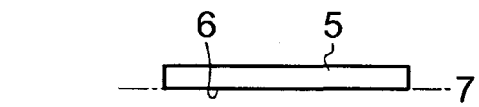
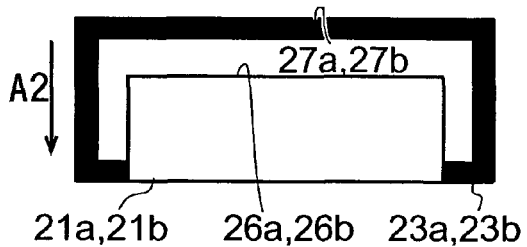
Fig. 3(b)
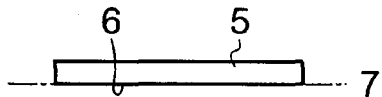
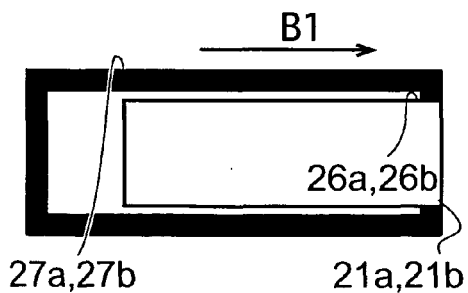
Fig. 4(a)
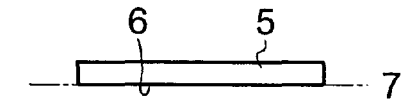
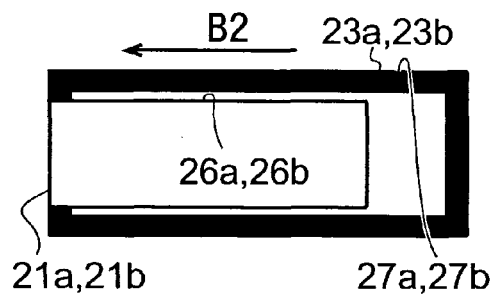
Fig. 4(b)

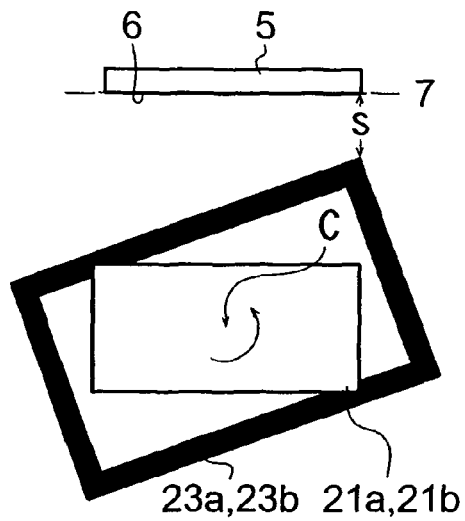 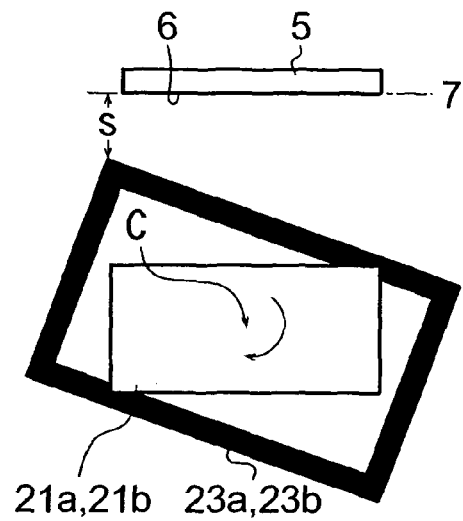
Fig. 5(a)  Fig. 5(b)
Fig. 6
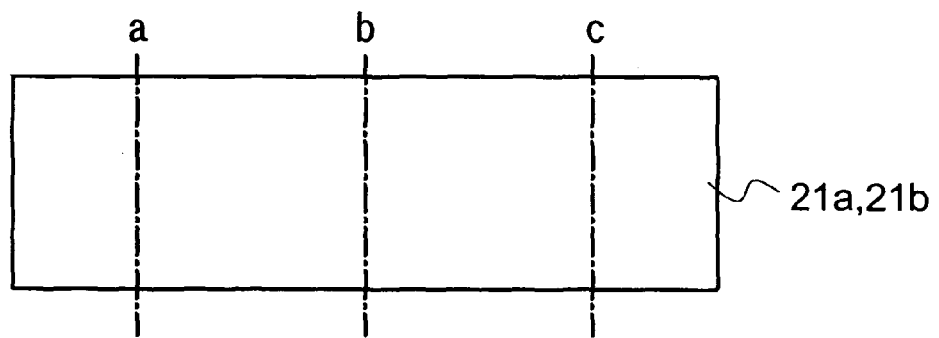

PRIOR ART

SPUTTERING APPARATUS AND FILM-FORMING PROCESSES

The present invention is a Continuation of International Application No. PCT/JP2006/319962 filed Oct. 5, 2006, which claims priority to Japan Patent Document No. 2005-303490, filed on Oct. 18, 2005. The entire disclosures of the prior applications are hereby incorporated by reference herein in their entireties.

BACKGROUND

The present invention relates to sputtering apparatus and film-forming processes using them.

Organic EL devices have recently attracted attention as display devices.

FIG. 10 is a schematic cross-sectional diagram for illustrating the structure of an organic EL device 201.

This organic EL device 201 includes a lower electrode 214, organic layers 217, 218 and an upper electrode 219 deposited in this order on an object to be film-formed 211, whereby light is emitted in or at the interfaces of the organic layers 217, 218 when a voltage is applied across the upper electrode 219 and the lower electrode 214. If the upper electrode 219 is formed of a transparent conductive film (such as, an ITO film (indium tin oxide film)), the emitted light passes through the upper electrode 219 and emit to the outside.

The upper electrode 219, as described above, is mainly formed by vapor deposition.

Vapor deposition has the advantage of forming good interfaces without damaging organic films 217, 218 when protective films for the upper electrode 219 or organic EL device are formed because particles released by sublimation or evaporation from a vapor deposition source are neutral low-energy particles (about several electron volts).

However, it has the disadvantages that dark spots may be generated or electrodes may be separated by long-term operation because films formed by vapor deposition poorly adhere to organic films. In terms of productivity, it has disadvantages; such as, difficulty in thickness distribution for large area due to the point evaporation source, deterioration of evaporation boat and short maintenance cycles due to difficulty in continuous feeding.

A possible solution to the above-mentioned problems is sputtering. However, sputtering with parallel board-shaped targets, wherein the object is opposed to the surface of the target, has disadvantages in that luminescence starting voltage is very high or no luminescence occurs in activation tests of organic EL devices when an upper electrode made of aluminum is formed on an organic layer. This results from the fact that charged particles in a plasma (Ar ions, secondary electrons, recoil Ar ions) or sputtered particles having high kinetic energy enter onto the organic film and destroy the interface of the organic film to hinder favorable injection of electrons.

Thus, strategies were investigated in the conventional technologies, among which a sputtering apparatus 110 as shown in FIG. 11 was proposed. This sputtering apparatus 110 has a vacuum chamber 11, wherein two targets 121a, 121b are fixed to backing plates 122a, 122b at their back surfaces while their surfaces are opposite with each other in parallel at a predetermined distance therebetween in the vacuum chamber 111.

Magnet members 115a, 115b are provided toward the back surfaces of the backing plates 122a, 122b. The magnet members 115a, 115b comprise annular magnets 123a, 123b fixed to yokes 129a, 129b.

Each of the magnets 123a, 123b has one magnetic pole facing the targets 121a, 121b and the other magnetic pole facing the opposed direction to the targets, and the magnetic poles of the two magnets 123a, 123b facing targets 121a, 121b have opposite polarities. Consequently, when the north pole of one magnet 123a faces the target 121a, the south pole of the other magnet 123b faces the target 121b, whereby magnetic field lines are generated between the two magnets 123a, 123b. The magnetic field lines generated between the magnets 123a, 123b are cylindrical because the magnets 123a, 123b are annular.

When the vacuum chamber 111 is evacuated by an evacuation system 116 and a sputtering gas is introduced from a gas feed system 117 and a voltage is applied to the targets 121a, 121b, a plasma of the sputtering gas is generated in the space between the targets 121a, 121b so that the surfaces of the targets 121a, 121b are sputtered.

An object to be film-formed 113 is placed laterally to the space between the targets 121a, 121b, and a thin film is formed on the surface of the object 113 by sputtered particles ejected in a slant direction from the targets 121a, 121b and released into the vacuum chamber 111.

In this sputtering apparatus 110, the plasma is not leaked toward the object 113 because the space between the opposed targets 121a, 121b is enclosed by cylindrical magnetic field lines formed between the two magnets 123a, 123b and the plasma is confined by the magnetic field lines. Thus, the object 113 is not exposed to charged particles in the plasma, and the organic thin film exposed on the surface of the object 113 is not damaged.

In the sputtering apparatus 110, however, a phenomenon occurs in which targets 121a, 121b are more deeply etched in center parts than peripheral parts by sputtering. Reference numbers 131a, 131b in FIG. 12 represent eroded regions where targets 121a, 121b are deeply etched and the thickness is reduced, and reference numbers 132a, 132b in the same figure represent uneroded regions where targets 121a, 121b are not etched and the thickness remains large.

The targets 121a, 121b must be changed before the targets 121a, 121b are etched so deeply to expose the backing plates 122a, 122b at their back surfaces because an abnormal discharge occurs.

In the conventional sputtering apparatus 110, the target utilization efficiency is low because the targets 121a, 121b had to be changed when the targets 121a, 121b are deeply etched only in parts even if the thickness is less reduced in the remaining parts. These problems are disclosed in JPA 11-162652 and JPA 2005-032618, for example.

SUMMARY OF THE INVENTION

The present invention was made to solve the problems described above with the purpose of increasing the target utilization efficiency.

In order to solve the problems described above, the present invention provides a sputtering apparatus including a vacuum chamber, first and second board-shaped targets, and first and second ring-shaped magnet members magnetized in the direction of the thickness of the annulus, wherein the first and second targets are placed at a predetermined distance therebetween in the vacuum chamber with their surfaces being in parallel to each other, and the first and second magnet members are placed behind the first and second targets in such a manner that opposite magnetic poles face each other so that sputtered particles are released from an end part of a sputtering space between the first and second targets toward a film-forming surface on an object to be film-formed. The sputtering apparatus further includes a moving means for moving the first and second magnet members relative to the first and second targets in planes parallel to the surfaces of the first and second targets.

In an embodiment of the sputtering apparatus of the present invention, the sputtering apparatus includes a transporting path situated near the end part of the sputtering space in the vacuum chamber, the object is moved along to the transporting path, and a transporting mechanism moving the object along the transporting path while maintaining a state in which the film-forming surface is situated in a plane facing the end part of the sputtering space, wherein the surfaces of the first and second targets are situated on planes orthogonal to the plane and crossing the transporting path.

In another embodiment of the sputtering apparatus of the present invention, one side of the first target and one side of the second target are situated in parallel with each other at the edge of the end part of the sputtering space, and the moving means is constructed to move the first and second magnet members in directions along the sides of the first and second targets situated at the edge of the end part and in directions orthogonal to them.

In another embodiment of the sputtering apparatus of the present invention, the moving means moves the first and second magnet members while maintaining a state whereby the lateral faces of the first and second magnet members on the side of the transporting path are in parallel with the plane in which the film-forming surface is situated.

In another embodiment of the sputtering apparatus of the present invention, the moving means rotates the first and second magnet members by a predetermined angle in directions of forward and backward rotations with a predetermined center of rotation situated within the annulus.

In another embodiment of the sputtering apparatus of the present invention, the outer circumferences of the first and second magnet members are greater than the outer circumferences of the first and second targets, and the moving means moves the first and second magnet members in such a manner that the outer circumferences of the first and second targets may not run over the outer circumferences of the first and second magnet members.

The present invention provides a film-forming process using a sputtering apparatus which includes a vacuum chamber, first and second board-shaped targets, and first and second ring-shaped magnet members magnetized in the direction of the thickness of the rings. The first and second targets are placed at a predetermined distance therebetween in the vacuum chamber with their surfaces being in parallel with each other; and the first and second magnet members are placed behind the first and second targets in such a manner that opposite magnetic poles face each other, whereby sputtered particles are released from an end part of a sputtering space between the first and second targets toward a film-forming surface of an object to be film-formed to form a thin film on the film-forming surface. The process further includes the step of performing sputtering while moving the first and second magnet members relative to the first and second targets in planes parallel to the first and second targets.

In an embodiment of the film-forming process of the present invention, the first and second magnet members are moved while the first and second magnet members remain stationary relative to each other.

In another embodiment of the film-forming process of the present invention, one side of the first target and one side of the second target are situated in parallel with each other at an edge of the end part of the sputtering space, and the first and second magnet members are moved by reciprocally moving the first and second magnet members in directions along the sides of the first and second targets situated at the edge of the end part and in directions orthogonal to them.

In another embodiment of the film-forming process of the present invention, the first and second magnet members are moved by alternately rotating the first and second magnet members by a predetermined angle in directions of forward and backward rotations with a predetermined center of rotation.

In another embodiment of the film-forming process of the present invention, the forward and backward rotations of the first and second magnet members allow the first and second magnet members approach the same height as the plane in which the film-forming surface is situated.

In the present invention as described above, the first and second magnet members move in planes parallel to the first and second targets so that the distance between the surfaces of the first and second magnet members on which the magnetic poles are situated; and the surfaces of the first and second targets are constant. Thus, magnetic fields having the same intensity move on the surfaces of the first and second targets when the first and second magnet members move.

The surfaces of the first and second targets are situated in planes orthogonal to the plane in which the film-forming surface is situated, so that a film is formed by sputtered particles having low energy ejected in a slant direction from the surfaces of the first and second targets, whereby the thin film exposed on the surface of the object is less damaged.

The first and second magnet members move in the same direction at the same speed so that they remain stationary relative to each other. Thus, cylindrical magnetic field lines generated between the first and second magnet members are maintained even when the first and second magnet members move.

By moving the first and second magnet members, erosion regions on the first and second targets enlarge, whereby the first and second targets can be used at high efficiency.

BRIEF DESCRIPTION OF THE DRAWINGS

FIG. 2 is a cross-sectional diagram for illustrating magnetic field lines.

FIGS. 3(a) and 3(b) are schematic diagrams showing movements in two directions orthogonal to two sides.

FIGS. 4(a) and 4(b) are schematic diagrams showing movements in two directions along two sides.

FIG. 5(a) is a schematic diagram showing a forward rotation, and FIG. 5(b) is a schematic diagram showing a backward rotation.

FIG. 6 is a plan view illustrating measuring sites on a target.

DETAILED DESCRIPTION OF THE EMBODIMENTS

Figure 1:
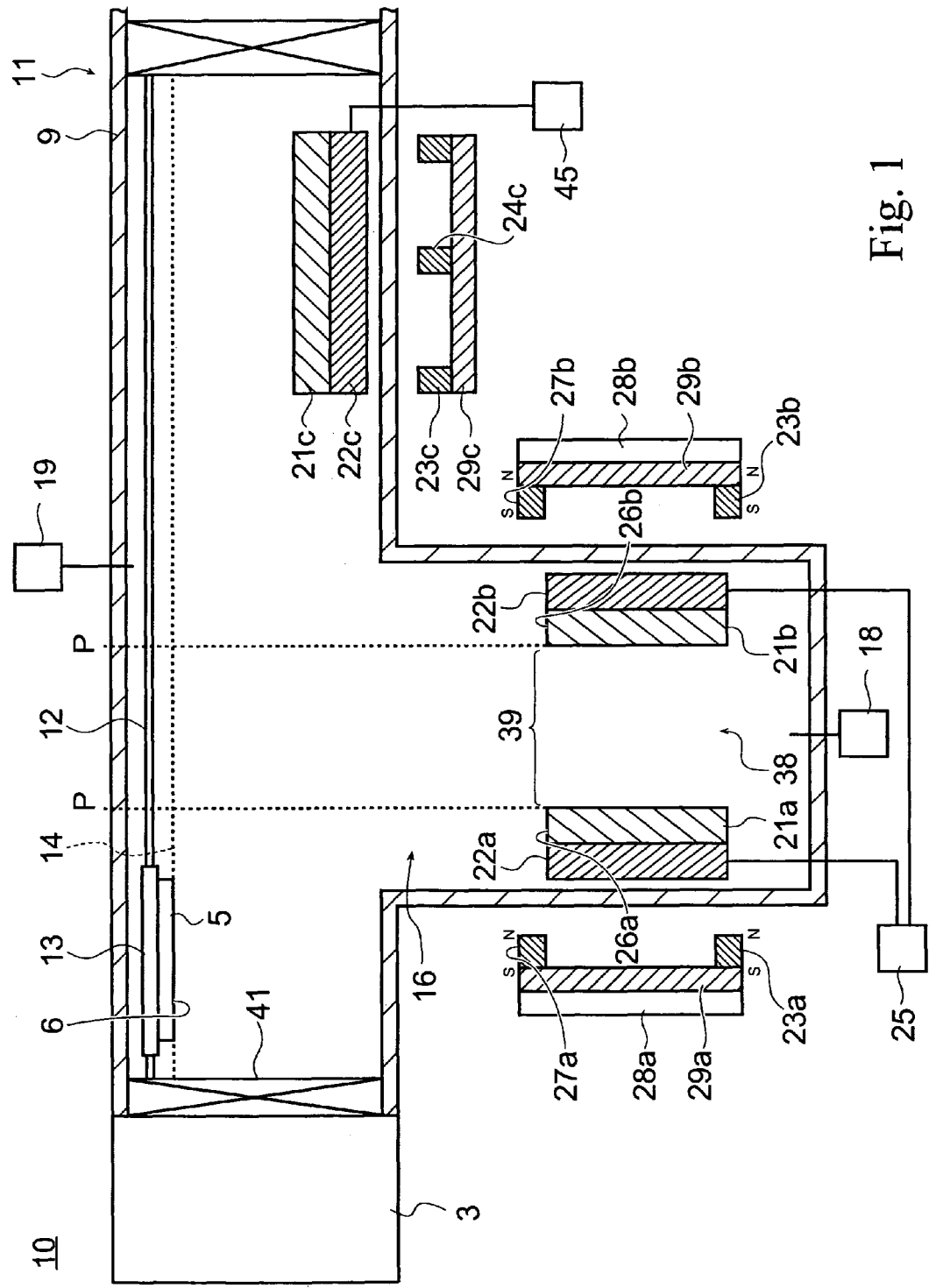
FIG. 1 is a cross-sectional diagram of a sputtering apparatus of the present invention.

Reference number 10 in FIG. 1 represents a sputtering apparatus according to an example of the present invention.

This sputtering apparatus 10 is a vertical inter back type machine including a vacuum chamber 11. The vacuum chamber 11 includes a transporting chamber 9 and a sputtering chamber 16 connected to the transporting chamber 9. First and second targets 21a, 21b are contained in the sputtering chamber 16.

The first and second targets 21a, 21b (or first and second planar targets 21a, 21b) are rectangular plates with their surfaces being in parallel with each other at a predetermined distance therebetween. Reference number 38 in FIG. 1 represents a sputtering space between the first and second targets 21a, 21b.

An evacuation system 19 and a gas feed system 18 are connected to the vacuum chamber 11 so that the vacuum chamber 11 is evacuated by the evacuation system 19 and a sputtering gas is introduced from the gas feed system 18 to form a film-forming ambiance at a predetermined pressure.

A power supply 25 is provided outside the vacuum chamber 2, and the power supply 25 is connected to backing plates 22a, 22b but not to the vacuum chamber 2 so that when a voltage is applied to the first and second targets 21a, 21b via the backing plates 22a, 22b from the power supply 25 while the film-forming ambiance is maintained and the vacuum chamber 2 connect to the ground potential, a plasma is generated in the sputtering space 38 and the first and second targets 21a, 21b are sputtered, whereby sputtered particles are released into the sputtering space 38.

Reference number 39 in FIG. 1 represents an end part of the sputtering space 38 on the side of the transporting chamber 9; and the sputtered particles released into the sputtering space 38 are released from the end part 39 toward the transporting chamber 9. The first and second targets 21a, 21b have straight sides 26a, 26b in parallel with the transporting chamber 9, respectively; and the two sides 26a, 26b are situated at the edge of the end part 39 of the sputtering space 38 on the side of the transporting chamber 9. Thus, sputtered particles run out from between the two sides 26a, 26b toward the transporting chamber 9.

The two sides 26a, 26b are the long sides of the first and second targets 21a, 21b; and the distance from one long side situated at the edge of the end part 39 to the other long side is small so that many sputtered particles are released from the end part 39 of the sputtering space 38 without colliding again with the first and second targets 21a, 21b.

A transporting path 14 for moving an object to be film-formed 5 is provided inside the transporting chamber 9. The two sides 26a, 26b of the first and second targets 21a, 21b situated at the end part 39 are located in one plane perpendicular to the surfaces of the first and second targets 21a, 21b; and the transporting path 14 extends in a plane parallel to the two sides 26a, 26b in a direction orthogonal to the planes P in which the surfaces of the first and second targets 21a, 21b are located. When a gate valve 41 is opened to transfer an object to be film-formed 5 from an L/UL chamber 3 into the transporting chamber 9 and the object 5 is held on a carrier 13 and transported by a transporting mechanism 12, the object 5 moves along the transporting path 14.

The object 5 has a film-forming surface 6 on which a thin film as described below is to be formed; and when the object 5 moves, the film-forming surface 6 moves in a plane parallel to the plane in which the above-mentioned two sides 26a, 26b are situated.

The transporting path 14 is designed in such a manner that when the object 5 moves, its film-forming surface 6 passes in front of the end part 39 of the sputtering space 38, whereby sputtered particles reach the film-forming surface 6 and a thin film grows when the film-forming surface 6 passes in front of the end part 39 of the sputtering space 38.

Plate yokes 29a, 29b are provided behind the first and second targets 21a, 21b outside the vacuum chamber 11; and first and second ring-shaped magnet members 23a, 23b (or first and second annular magnet members 23a, 23b) are fixed to the surfaces of the yokes 29a, 29b.

The first and second magnet members 23a, 23b are magnetized in the direction of the thickness, and the magnetic pole of the first magnet member 23a facing the first target 21a and the magnetic pole of the second magnet member 23b facing the second target 21b have opposite polarities so that magnetic field lines run from the surface of one of the first and second magnet members 23a, 23b on the side of the targets 21a, 21b into the surface of the magnetic pole of the other magnet member on the side of the targets 21a or 21b.

Magnetic field lines M generated between the first and second magnet members 23a, 23b are cylindrical (FIG. 2) because the first and second magnet members 23a, 23b are annular as described above.

The outer circumferences of the first and second magnet members 23a, 23b are greater than the outer circumferences of the first and second targets 21a, 21b so that the first and second targets 21a, 21b are situated inside the outer circumferences of the first and second magnet members 23a, 23b. Thus, the first and second targets 21a, 21b are situated in the cylinder of magnetic field lines M.

The yokes 29a, 29b are fixed to moving means 28a, 28b, and the moving means 28a, 28b move the yokes 29a, 29b together with the first and second magnet members 23a, 23b so that the first and second magnet members 23a, 23b can move relative to the first and second targets 21a, 21b in planes parallel to the surfaces of the first and second targets 21a, 21b.

Large regions on the surfaces of the first and second targets 21a, 21b are sputtered because deeply eroded regions determined by the relative position of magnetic field lines and the first and second targets 21a, 21b move together with magnetic field lines on the surfaces of the first and second targets 21a, 21b.

The moving means 28a, 28b are designed to move the first and second magnet members 23a, 23b, while the entire outer circumferences of the first and second targets 21a, 21b are kept within the outer circumferences of the first and second annular magnet members 23a, 23b, whereby the surfaces of the first and second targets 21a, 21b are always situated in the cylindrical magnetic field lines and no plasma is generated outside the cylindrical magnetic field lines. Thus, no charged particles in the plasma reach the film-forming surface 6 so that material exposed on the film-forming surface 6 (e.g., organic thin films) is not damaged.

FIGS. 3(a), (b) and FIGS. 4(a), (b) schematically show relative positions of the first and second magnet members 23a, 23b and the first and second targets 21a, 21b and the film-forming surface 6, in which the two sides 26a, 26b situated at the edge of the end part 39 of the sputtering space 38 are oriented to be orthogonal to the transporting path 14 in a plane parallel to the plane 7 of which the film-forming surface 6 is situated.

The sides 27a, 27b of the first and second magnet members 23a, 23b on the side of the end part 39 are straight, respectively, and parallel to the two sides 26a, 26b situated at the edge of the end part 39, whereby the sides 27a, 27b of the first and second magnet members 23a, 23b on the side of the end part 39 are also oriented to be orthogonal to the transporting path 14 in a plane parallel to the plane 7 of which the film-forming surface 6 is situated.

The moving means 28a, 28b are designed to move the first and second magnet members 23a, 23b in two directions A1, A2 orthogonal to the two sides 26a, 26b situated at the edge of the end part 39 and in two directions B1, B2 along the two sides 26a, 26b.

When the first and second magnet members 23a, 23b move in two directions A1, A2 orthogonal to the two sides 26a, 26b situated at the edge of the end part 39, the sides 27a, 27b of the first and second magnet members 23a, 23b on the side of the end part 39 move in two directions orthogonal to the plane 7 in which the film-forming surface 6 is situated while they remain parallel to the plane 7 and the sides 27a, 27b uniformly approach or uniformly move away from the film-forming surface 6. Therefore, uniform amounts of sputtered particles reach anywhere on the film-forming surface 6 regardless of the direction in which they move.

When the first and second magnet members 23a, 23b move in two directions B1, B2 along the two sides 26a, 26b situated at the edge of the end part 39, the sides 27a, 27b of the first and second magnet members 23a, 23b on the side of the end part 39, however, move in a direction orthogonal to the transporting path 14 in planes parallel to the plane 7 in which the film-forming surface 6 is situated.

If the first and second magnet members 23a, 23b move in only either one direction along the two sides 26a, 26b, non-uniform amounts of sputtered particles reach the film-forming surface 6 because the first and second magnet members 23a, 23b approach one end part of the film-forming surface 6 and move away from the other end part, but the first and second magnet members 23a, 23b move in both of two directions along the two sides 26a, 26b at a higher speed than the speed at which the object 5 is transported so that averaged amounts of sputtered particles reach the film-forming surface 6. Thus, a first thin film having a uniform thickness is formed on the film-forming surface 6.

A third target 21c fixed to a backing plate 22c is placed in the transporting chamber 9 downstream of the part of the transporting path 14 to which the sputtering chamber 16 is connected.

A third magnet member 23c fixed to a yoke 29c is placed behind the third target 21c, and the third magnet member 23c forms magnetic field lines parallel to the surface of the third target 21c on that surface. The third target 21c is connected to a power supply 45, and when a voltage is applied from the power supply 45 to the third target 21c while the vacuum chamber 11 remains at the ground potential, the surface of the third target 21c is sputtered at high efficiency by the parallel magnetic field lines.

The surface of the third target 21c faces the transporting path 14 so that the object 5 passes in front of the third target 21c, whereby sputtered particles vertically ejected from the third target 21c reach the object 5.

The first thin film has been formed on the surface of the object 5 by the first and second targets 21a, 21b, and sputtered particles of the third target 21c enter the surface of the first thin film to form a second thin film without damaging a thin film under the first thin film.

The second thin film is formed at a higher speed than that of the first thin film because sputtered particles forming the second thin film are particles vertically ejected from the surface of the third target 21c and the sputtered particles are more abundant than sputtered particles entering from the first and second targets 21a, 21b.

For example, the first to third targets 21a to 21c consist of a transparent conductive material (such as ITO), and the first and second thin films are thin films of a transparent conductive material so that a single-layer transparent conductive film consisting of the first and second thin films is formed on the film-forming surface 6. If the third target 21c is formed of a different material from those of the first and second targets 21a, 21b, a thin film of a two-layer structure is formed on the film-forming surface 6.

The first and second magnet members 23a, 23b can be any ring shape (such as, rectangular, elliptic or the like), but if the first and second targets 21a, 21b are rectangular, the annular shape of the first and second magnet members 23a, 23b is preferably rectangular with their two long sides and short sides being parallel to the long sides and short sides of the first and second targets 21a, 21b, respectively.

If the long sides and short sides of the first and second targets 21a, 21b are parallel to the long sides and short side of the first and second magnet members 23a, 23b, the first and second magnet members 23a, 23b can be moved until the long sides and short sides of the first and second targets 21a, 21b overlap the outer circumferential edges of the long sides and the outer circumferential edges of the short sides of the first and second magnet members 23a, 23b, whereby they can be moved by a longer distance as compared with cases where the first and second targets 21a, 21b or the first and second magnet members 23a, 23b are elliptic or the long sides and short sides of the first and second targets 21a, 21b are oblique to the long sides and short sides of the first and second magnet members 23a, 23b.

The order and number of movements in two directions A1, A2 orthogonal to the two sides 26a, 26b and in two directions B1, B2 along the two sides 26a, 26b are not specifically limited, but larger regions are eroded when movements in two directions A1, A2 orthogonal to the two sides 26a, 26b and movements in directions B1, B2 along the two sides 26a, 26b are alternately repeated.

The order and number of movements in two directions A1, A2 orthogonal to the two sides 26a, 26b and in two directions B1, B2 along the two sides 26a, 26b are not specifically limited, and for example, one or more movements in two orthogonal directions A1, A2 may be followed by one or more movements in two parallel directions B1, B2.

The amount of which the first and second magnet members 23a, 23b are moved is not specifically limited either, but when the first and second targets 21a, 21b are rectangular with a width of 70 mm and a length of 330 mm, for example, the first and second magnet members 23a, 23b move by 60 mm or less in directions along the two sides (long sides) of the first and second targets 21a, 21b and 20 mm or less in directions orthogonal to the two sides.

Although the foregoing explanation relates to cases where the first and second magnet members 23a, 23b are straightly moved, the present invention is not limited to such cases.

FIGS. 5(a) and 5(b) show another example of moving the first and second magnet members 23a, 23b wherein the moving means 28a, 28b are designed to alternately repeat forward and backward rotations of the first and second magnet members 23a, 23b with a predetermined center of rotation C in planes parallel to the first and second targets 21a, 21b.

The center of rotation C and the angles of forward and backward rotations are determined in such a manner that uniform amounts of sputtered particles reach the periphery and center of the film-forming surface 6.

For example, the center of rotation C is the center of the ring of the first and second magnet members 23a, 23b and situated just behind the first and second targets 21a, 21b.

Here, the annular shape of the first and second magnet members 23a, 23b is symmetrical with the center of rotation C so that the moving means 28a, 28b rotate the first and second magnet members 23a, 23b forwardly and backwardly with the center of rotation C by the same angle, whereby the shortest distance S from the first and second magnet members 23a, 23b to the plane in which the film-forming surface 6 is situated is equal whether the first and second magnet members 23a, 23b are rotated forwardly or backwardly.

The angular speed of forward and backward rotations of the first and second magnet members 23a, 23b are sufficiently increased as compared to the transporting speed of the object 5, and multiple forward and backward rotations had performed before the film-forming surface 6 has passed in front of the end part 39 of the sputtering space 38 so that uniform amounts of sputtered particles reach the film-forming surface 6 and thus a first thin film having a uniform thickness grows on the film-forming surface 6.

When the first and second magnet members 23a, 23b are forwardly and backwardly rotated, the film-forming surface 6 is also less damaged by preventing the outer circumferences of the first and second targets 21a, 21b from running over the outer circumferences of the annuli of the first and second magnet members 23a, 23b in order to avoid the generation of a plasma outside cylindrical magnetic field lines.

Transparent conductive thin films that can be formed by the present invention include thin films of various transparent conductive materials (such as, ITO thin film, SnO2 thin film, ZnOx thin film, IZO thin film, etc.).

The material from which the targets are formed is not limited to transparent conductive materials, but a target based on a metal material can be used to form a metal film on the film-forming surface or a target based on an insulating material (such as silicon oxide or silicon nitride) can be used to form a protective film on the film-forming surface, for example.

Moreover, a reactive gas having high reactivity to the material of the target (such as e.g., oxygen gas, hydrogen gas or water) can be used for sputtering to form a film of the reaction product of the material of the target and the reactive gas on the film-forming surface. The type of the sputtering gas is not specifically limited either, and common sputtering gases (such as, e.g., Ar, Ne, Kr) can be used.

The first to third targets 21a-21c may be the same material, or may be formed from different materials. When the first and second targets 21a, 21b in the first sputtering chamber 16 are formed of different materials, the first thin film is a composite film consisting of two or more materials, and when the third target 21c in the second sputtering chamber 17 is formed of a material different from that of the first sputtering chamber 16, a laminate film including a second thin film having a composition different from that of the first thin film on the first thin film is obtained.

Although the foregoing explanation relates to cases where the first and second magnet members 23a, 23b are moved while the first and second targets 21a, 21b are fixed, the present invention is not limited to such cases. The first and second targets 21a, 21b may be moved together with the first and second magnet members 23a, 23b so far as the first and second magnet members 23a, 23b move relative to the first and second targets 21a, 21b or the first and second targets 21a, 21b may be moved while the first and second magnet members 23a, 23b are fixed.

The orientation of the magnetic poles of the first and second magnet members 23a, 23b is not specifically limited either, and for example, when the first magnet member 23a has a south pole on the surface facing the second magnet member 23b, the second magnet member 23b has a north pole on the surface facing the first magnet member 23a, and when the first magnet member 23a has a north pole on the surface facing the second magnet member 23b, the second magnet member 23b has a south pole on the surface facing the first magnet member 23a.

A DC voltage or AC voltage or superposed voltage of both may be applied to the first and second targets 21a, 21b.

The first and second magnet members 23a, 23b may be placed outside the vacuum chamber 11 or inside the vacuum chamber 11. When the first and second magnet members 23a, 23b are placed outside the vacuum chamber 11, the part of the vacuum chamber 11 between the first and second magnet members 23a, 23b is desirably formed of a material having magnetic permeability.

EXAMPLES

Sputtering was performed by alternately repeating a reciprocal movement orthogonal to the two sides 26a, 26b of the first and second magnet members 23a, 23b and a reciprocal movement along the two sides 26a, 26b to form an ITO film on the surface of an object to be film-formed under the film-forming conditions shown below.

The object used is a product in progress of an organic EL device prepared by first washing the surface of a glass substrate having a patterned Ag/ITO electrode with an O2 plasma and successively forming organic EL layers by vapor deposition in an organic EL production apparatus (SATELLA from ULVAC, Inc.) in order to obtain an object to be film-formed 5.

A hole transport layer having a thickness of 35 nm consisting of, for example, 4,4'-bis[N-(1-naphthyl)-N-phenylamino] biphenyl (hereinafter abbreviated as NPB) is formed, then a luminescent layer having a thickness of 5 nm comprising, for example, 8-oxyquinolino aluminum complex (hereinafter abbreviated as Alq3) is formed, and then a cathode buffer layer having a thickness of 5 nm consisting of LiF is formed by vapor deposition.

The object 5 is transferred into a nitrogen displaced glove box installed in the organic EL production system; and the object 5 is placed in an airtight container and the airtight container was removed from the glove box into the ambiance. Then, the airtight container is introduced into an N2 glove box installed in the sputtering apparatus 10, and the airtight container was opened in the sputtering apparatus to remove the object 5 and the object 5 is loaded on the carrier 13 installed in the L/UL chamber 3.

Then, a mask for forming an ITO electrode is applied on the surface of the object 5 having the buffer layer (film-forming surface) and the chamber is evacuated.

Once a predetermined pressure has been reached, the gate valve 41 was opened and the object 5 on the carrier 13 was transported into the vacuum chamber 11.

The targets 21a-21c consisting of ITO are sputtered by alternately moving the first and second magnet members 23a, 23b in two directions along the two sides and in two directions orthogonal to the two sides, and the object 5 is allowed to laterally pass over the first and second targets 21a, 21b in order to form a first thin film consisting of an ITO film having a thickness of 20 nm and then, the object is passed over the third target 21c to form an ITO film having a thickness of 80 nm on the first thin film, thereby obtaining an organic EL device comprising an upper electrode consisting of the first and second thin films on the surface of the buffer layer of the object 5.

Film-forming conditions for the first and second thin films include a film-forming pressure 0.67 Pa and a sputtering gas (Ar gas) 200 SCCM for the opposed cathodes (first and second targets 21a, 21b), and a film-forming pressure 0.67 Pa, a sputtering gas (Ar gas) 200 SCCM, and a reactive gas (oxygen) 2.0 SCCM for the parallel planar cathode (third target 21c).

The input power is 1000 W (2.1 W/cm$^2$/cathode) DC power supply for the opposed cathodes, and 620 W (1 W/cm$^2$) DC power supply for the parallel planar cathode.

The dynamic deposition rate is 2 nm/min. in the opposed cathodes, and 8 nm/min in the parallel planar cathode. The transporting speed of the object 5 is 0.1 m/min.

The first and second targets 21a, 21b are rectangular with a width of 70 mm and a length of 330 mm. The first and second magnet members 23a, 23b had an outer circumferential width of 90 mm (magnet width 20 mm) and were moved by 20 mm in directions along the two sides and in directions orthogonal to the two sides.

After sputtering for a predetermined time, sputtering is stopped and the first and second targets 21a, 21b are removed and measured for erosion depth from one end to the other end at the points shown by dashed lines a, b, c in FIG. 6.

The measured values are shown in Table 1 below and graphs of the measured results are shown in FIG. 7(a)-(c).

TABLE 1

| | | | | | | | | | |
|---|---|---|---|---|---|---|---|---|---|
| | | | | measurement of erosion depth | | | | | |
| Point of measurement | Magnets fixed | | | Magnets moved (reciprocal movement) | | | Magnets moved (rotation) | | |
| 35 | 0 | 0 | 0 | −2.7 | −2.7 | −3.4 | −2.0 | 0 | −2.0 |
| 30 | 0 | −0.5 | −0.7 | −3.0 | −3.0 | −3.4 | −2.3 | −1.5 | −2.2 |
| 25 | 0 | −1.5 | −2.0 | −3.2 | −3.2 | −3.5 | −2.5 | −2.0 | −2.5 |
| 20 | −0.5 | −2.0 | −3.0 | −3.3 | −3.4 | −3.5 | −2.7 | −2.5 | −2.8 |
| 15 | −1.0 | −3.0 | −4.0 | −3.5 | −3.5 | −3.5 | −3.0 | −3.0 | −3.0 |
| 10 | −1.5 | −3.7 | −4.2 | −3.5 | −3.5 | −3.5 | −3.5 | −3.3 | −3.3 |
| 5 | −2.5 | −4.2 | −4.0 | −3.5 | −3.5 | −3.5 | −3.5 | −3.5 | −3.5 |
| 0 | −3.5 | −4.3 | −3.5 | −3.5 | −3.5 | −3.5 | −3.7 | −3.7 | −3.7 |
| −5 | −4.0 | −4.2 | −2.5 | −3.5 | −3.5 | −3.5 | −3.5 | −3.5 | −3.5 |
| −10 | −4.3 | −3.5 | −1.5 | −3.5 | −3.5 | −3.5 | −3.5 | −3.3 | −3.5 |
| −15 | −4.0 | −3.0 | −1.0 | −3.5 | −3.5 | −3.5 | −3.3 | −3.0 | −3.0 |
| −20 | −3.0 | −2.0 | −0.5 | −3.5 | −3.4 | −3.3 | −2.8 | −2.5 | −2.7 |
| −25 | −2.0 | −1.5 | 0 | −3.5 | −3.2 | −3.2 | −2.5 | −2.0 | −2.5 |
| −30 | −0.7 | −0.5 | 0 | −3.4 | −3.0 | −3.0 | −2.3 | −1.5 | −2.3 |
| −35 | 0 | 0 | 0 | −3.4 | −2.7 | −2.7 | −2.0 | 0 | −2.0 |

Figure 8A:
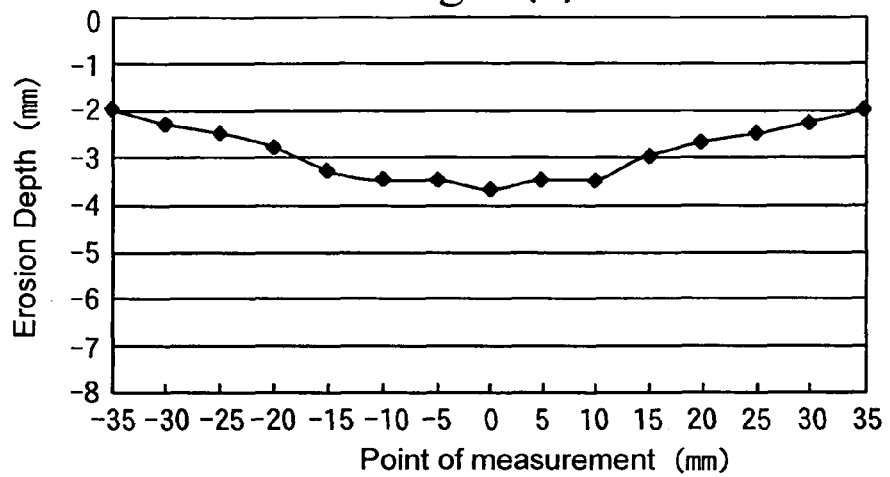
FIGS. 8(a) to 8(c) show erosion distributions after the target has been sputtered by a film-forming process according to another example of the present invention.
Figure 8B:
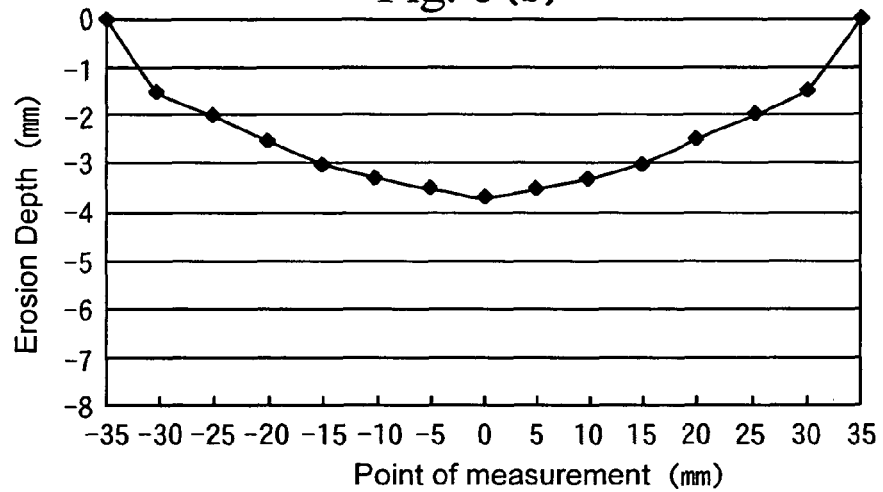
Figure 8C:
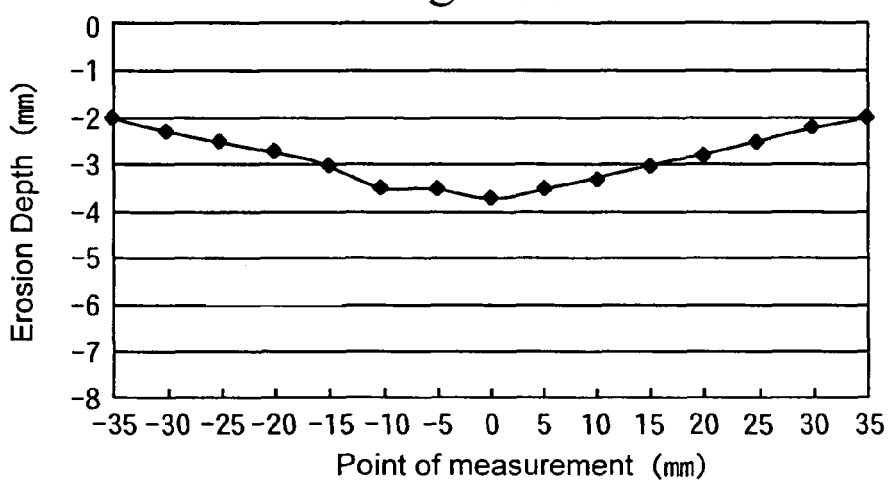

Then, the first and second magnet members 23a, 23b are forwardly and backwardly rotated by 20° instead of being moved in directions along and orthogonal to the two sides 26a, 26b, and the measured values are shown in Table 1 above and graphs of the measured results are shown in FIG. 8(a) to 8(c).

Figure 9A:
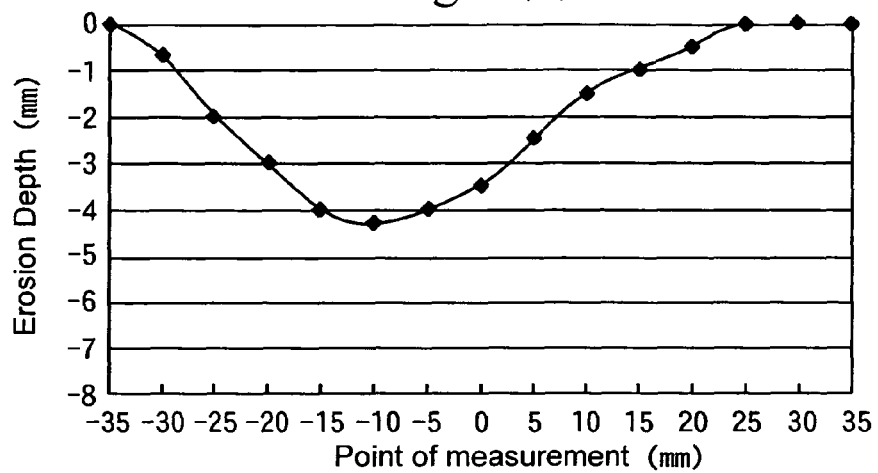
FIG. 9(a) to 9(c) show erosion distributions after the target has been sputtered by a conventional film-forming process.
Figure 9B:
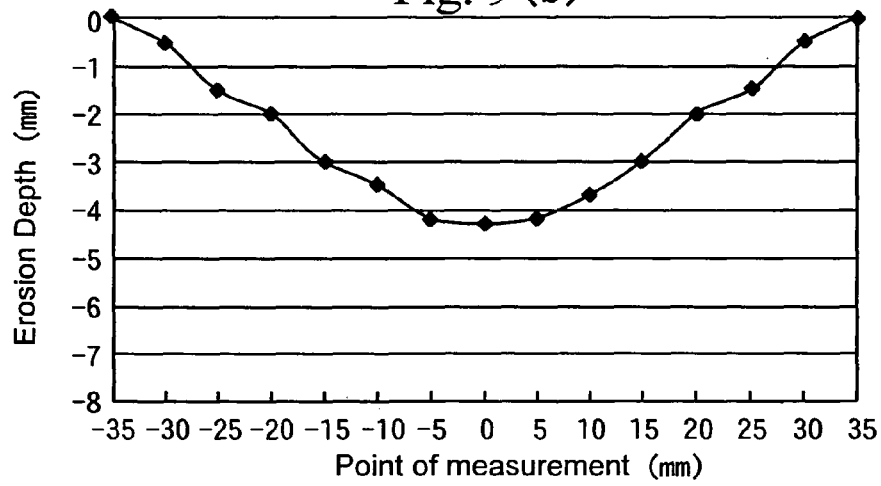
Figure 9C:
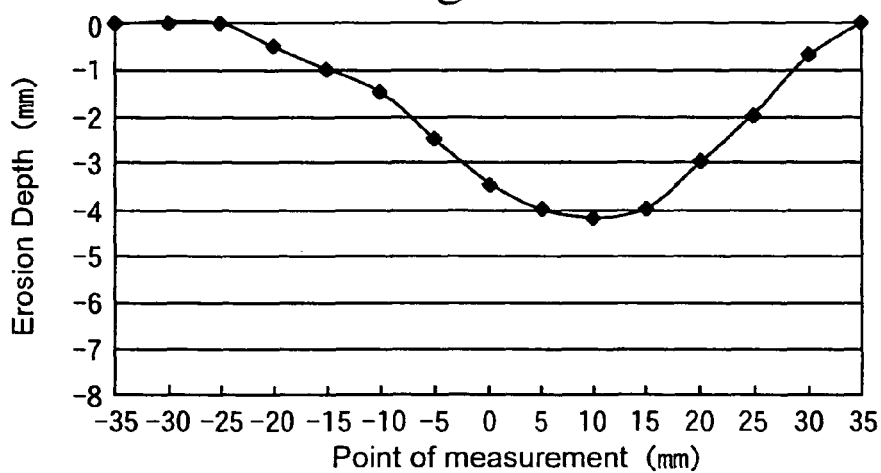
Figure 10:
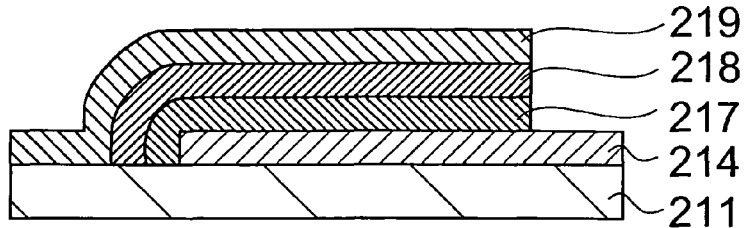
FIG. 10 is a cross-sectional diagram illustrating an organic EL device.
Figure 11:
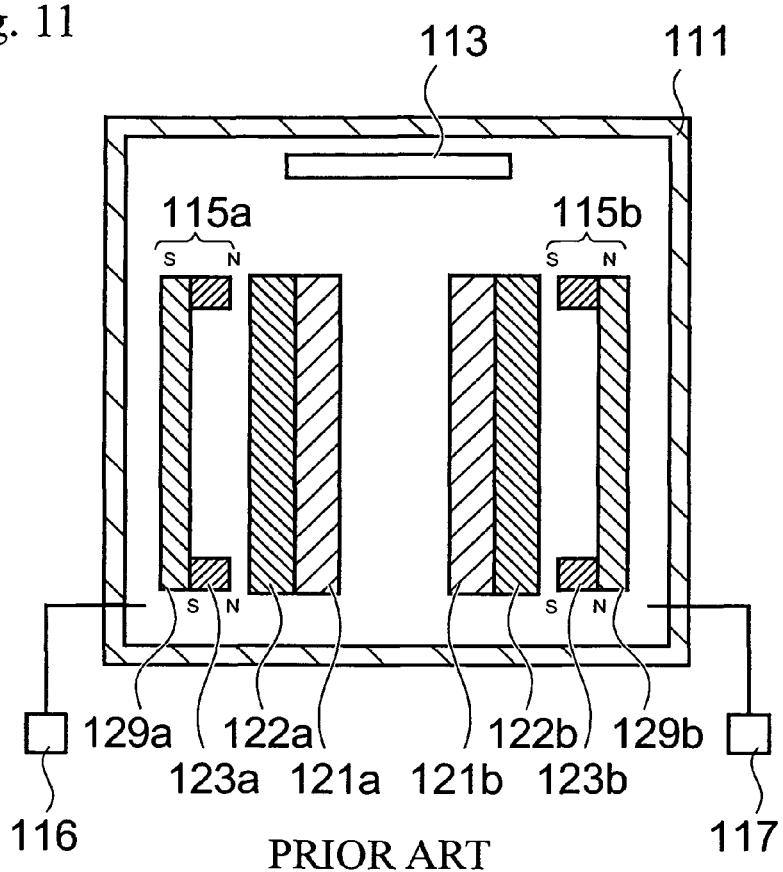
FIG. 11 is a cross-sectional diagram illustrating a conventional sputtering apparatus.
Figure 12:
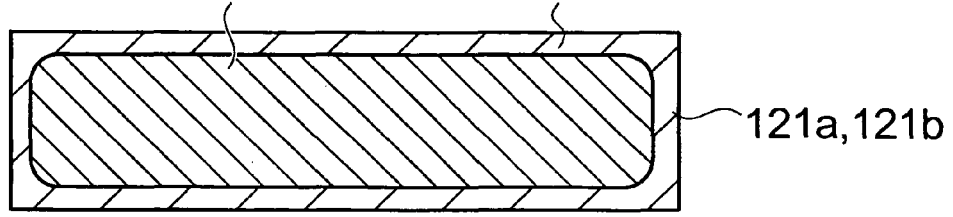
FIG. 12 is a plan view illustrating the state of the surface of a target.

Additionally, sputtering was performed while the first and second magnet members 23a, 23b remained fixed, and the measured values are shown in Table 1 above and graphs of the measured results are shown in FIG. 9(a) to 9(c).

Figure 7:
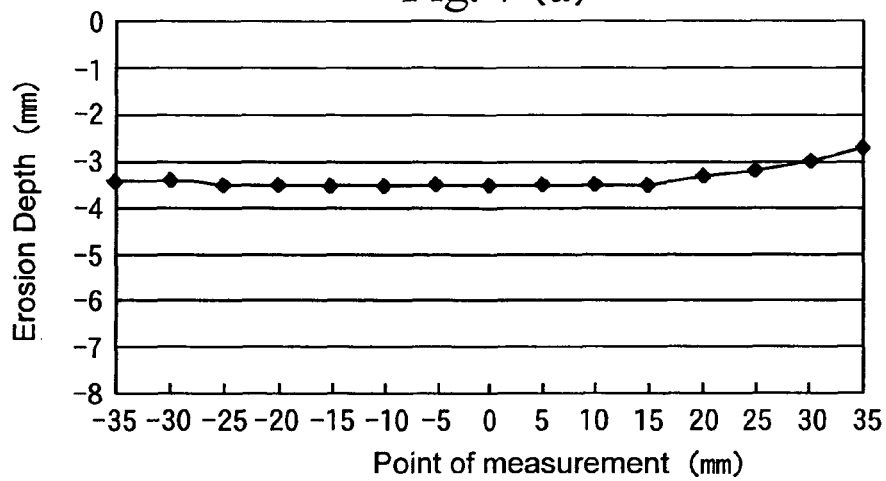
FIGS. 7(a) to 7(c) show erosion distributions after the target has been sputtered by a film-forming process according to an example of the present invention.
Figure 7:
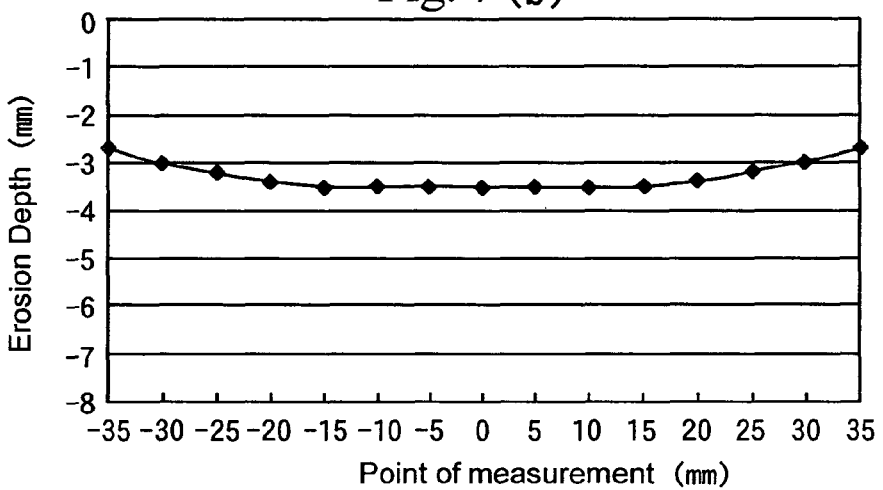
Figure 7:
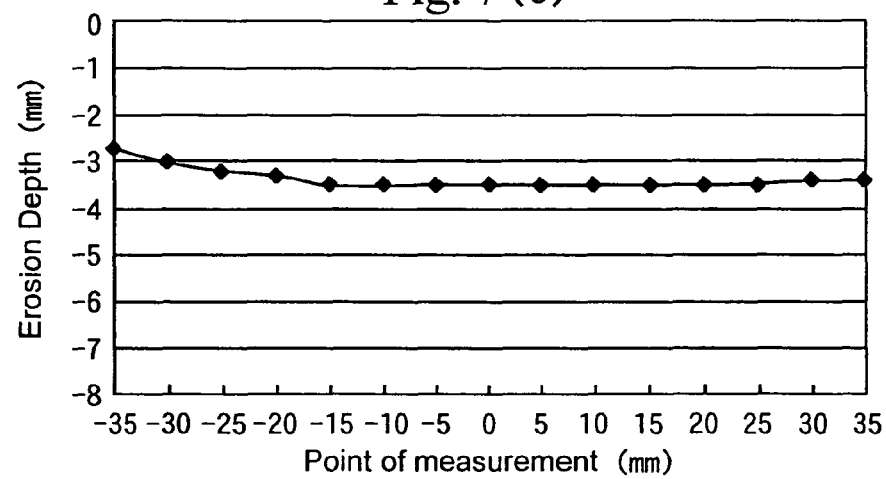

When comparing Tables 1-3 and FIGS. 7-9, it is apparent that erosion depth is more uniform when sputtering was performed while the first and second magnet members 23a, 23b are moved as compared to the case where sputtering is performed while the first and second magnet members 23a, 23b are fixed. This showed that uniform erosion depth is obtained and targets 21a, 21b are used at high efficiency when sputtering is performed while the first and second magnet members 23a, 23b are moved.

What is claimed is:

1. A sputtering apparatus comprising:
   a vacuum chamber;
   first and second planar targets having a rectangular shape; and
   first and second magnet members magnetized in the direction of the thickness of the magnet members,
   wherein the first and second targets are placed at a predetermined distance therebetween in the vacuum chamber with their surfaces being in parallel with each other, and
   wherein the first and second magnet members are placed behind the first and second targets in such a manner that opposite magnetic poles face each other, and sputtered particles are released from an end part of a sputtering space between the first and second targets toward a film-forming surface of an object to be film-formed;
   a transporting path situated near the end part of the sputtering space in the vacuum chamber, and the object is moved along to the transporting path;
   a transporting mechanised for moving the object along the transporting path while maintaining a suite in which the film-forming surface is situated in a plane facing the end part of the sputtering space,
   wherein surfaces of the first and the second targets are arranged on a plane orthogonal to the plane and crossing the transporting path,
   wherein one side of the first target and one side of the second target are situated in parallel with each other at an edge of the end part of the sputtering space;
   a moving means to move the first and second magnet members relative to the first and second targets in planes parallel to the surfaces of the first and second targets,
   wherein the outer peripheral edges of the first and second magnet members are greater than the outer peripheral edges of the first and second targets, and
   wherein the moving means moves the first and second magnet members behind the first and the second targets in such a manner that the first and second magnet members are moved in directions along the sides of the first and second targets situated at the edge of the end part or in directions orthogonal to the sides of the first and second targets situated at the edge of the end part while the outer peripheral edges of the first and second targets are kept within the outer peripheral edges of the first and second magnet members.

2. The sputtering apparatus according to claim 1, wherein the moving means moves the first and second magnet members while maintaining a state that the lateral faces of the first and second magnet members on the side of the transporting path are in parallel with a plane in which the film-forming surface is situated.

3. A film-forming process using a sputtering apparatus including a vacuum chamber, first and second planar and rectangular targets, and first and second magnet members magnetized in the direction of the thickness of the magnet members, wherein the first and second targets are placed at a predetermined distance therebetween in the vacuum chamber with their surfaces being in parallel with each other, and the first and second magnet members are placed behind the first and second targets in such a manner that opposite magnetic poles face each other, and sputtered particles are released from an end of a sputtering space between the first and second targets toward a film-forming surface on an object to be film-formed to form a thin film of the film-forming surface, the outer peripheral edges of the first and second magnet members are greater than the outer rectangular edges of the first and second targets, and the moving means moves the first and second magnet members in such a manner that the outer rectangular edges of the first and second targets are kept within the outer peripheral edges of the first and second magnet members, the process comprising the steps of:

providing a transporting path for moving the object situated near the end part of the sputtering space in the vacuum chamber;

transporting the object along the transporting path while maintaining a suite in which the film-forming surface is situated in a plane facing the end part of the sputtering space;

arranging surfaces of the first and the second targets on a plane orthogonal to the plane and crossing the transporting path;

situating one side of the first target and one side of the second target in parallel with each other at an edge of the end part of the sputtering space; and performing sputtering while moving the first and second magnet members behind the first and the second targets in such a manner that the first and second magnet members are moved relative to the first and second targets in a plane parallel to the surfaces of the first and second targets, and reciprocally moved in directions along the sides of the first and second targets situated at the edge of the end part or in directions orthogonal to the sides of the first and second targets situated at the edge of the end part while the outer rectangular edges of the first and second targets are kept within the outer peripheral edges of the first and second magnet members.

4. The film-forming process according to claim 3, wherein the first and second magnet members are moved while in the first and second magnet members, one magnet member remains stationary relative to the other magnet member.

* * * * *